United States Patent
Schneider et al.

(10) Patent No.: US 7,068,546 B2
(45) Date of Patent: Jun. 27, 2006

(54) INTEGRATED MEMORY HAVING A VOLTAGE GENERATOR CIRCUIT FOR GENERATING A VOLTAGE SUPPLY FOR A READ/WRITE AMPLIFIER

(75) Inventors: Ralf Schneider, München (DE); Joerg Vollrath, Olching (DE); Marcin Gnat, München (DE)

(73) Assignee: Infineon Technologies AG, Munich, DE (US)

( * ) Notice: Subject to any disclaimer, the term of this patent is extended or adjusted under 35 U.S.C. 154(b) by 0 days.

(21) Appl. No.: 10/815,856

(22) Filed: Apr. 2, 2004

(65) Prior Publication Data
US 2004/0223376 A1 Nov. 11, 2004

(30) Foreign Application Priority Data
Apr. 10, 2003 (DE) ................................ 103 16 581

(51) Int. Cl.
*G11C 7/00* (2006.01)
*G11C 8/00* (2006.01)
(52) U.S. Cl. .................. 365/189.09; 365/207; 365/226
(58) Field of Classification Search ........... 365/189.09, 365/205, 207, 208, 226
See application file for complete search history.

(56) References Cited

U.S. PATENT DOCUMENTS

| | | | | |
|---|---|---|---|---|
| 4,156,938 A | * | 5/1979 | Proebsting et al. | 365/205 |
| 5,416,743 A | * | 5/1995 | Allan et al. | 365/205 |
| 5,901,102 A | * | 5/1999 | Furutani | 365/226 |
| 5,970,007 A | | 10/1999 | Shiratake | |
| 6,337,824 B1 | | 1/2002 | Kono et al. | |
| 6,493,282 B1 | * | 12/2002 | Iida et al. | 365/226 |

* cited by examiner

*Primary Examiner*—Trong Phan
(74) *Attorney, Agent, or Firm*—Edell, Shapiro & Finnan, LLC

(57) ABSTRACT

An integrated memory contains a memory cell array, which has word lines and bit lines, and a read/write amplifier, which is connected to the bit lines for the assessing and amplifying data signals. A voltage generator circuit generates a voltage supply for application to the read/write amplifier. A potential difference is applied to the read/write amplifier using different supply potentials. The voltage generator circuit increases the potential difference applied to the read/write amplifier for a limited period of time during an assessment and amplification operation of the read/write amplifier. Charge-dependent control is implemented in the voltage generator circuit. An assessment and amplification operation can be carried out at a comparatively high switching speed and a low power consumption is possible.

4 Claims, 3 Drawing Sheets

INTEGRATED MEMORY HAVING A VOLTAGE GENERATOR CIRCUIT FOR GENERATING A VOLTAGE SUPPLY FOR A READ/WRITE AMPLIFIER

CROSS REFERENCE TO RELATED APPLICATIONS

This application claims priority under 35 USC §119 to German Application No. 10316581.9, filed on Apr. 10, 2003, and titled "Integrated Memory Having a Voltage Generator Circuit for Generating a Voltage Supply for a Read/Write Amplifier," the entire contents of which are hereby incorporated by reference.

FIELD OF THE INVENTION

The present invention relates to an integrated memory having a memory cell array, which has word lines for selecting memory cells and bit lines for reading out or writing data signals, and also having a read/write amplifier, which is connected to the bit lines for the purpose of assessing and amplifying data signals.

BACKGROUND

An integrated memory, for example, in the form of a DRAM, generally has a memory cell array comprising word lines and bit lines. In this case, the memory cells are arranged at crossover points of the bit lines and word lines. The memory cells are constructed, in particular, from a storage capacitor and a selection transistor, the selection transistor connecting the respective storage capacitor to one of the bit lines. The control terminals of the respective selection transistors are respectively connected to one of the word lines for the purpose of selecting the memory cells. An activated word line respectively turns on connected selection transistors. After the relevant word line has been selected, data signals of the memory cells along the selected word line are present on the corresponding bit lines. A data signal of a selected memory cell is assessed and amplified in a read/write amplifier of the memory cell array. During a read access, the data signals of selected memory cells are read out for further processing and, during a write access, data signals to be written are written to the selected memory cells.

During a memory access, a word line is first of all activated. As a result, the memory cells arranged along a word line are respectively connected up conductively to a bit line via the relevant selection transistor. In this case, the stored charge is divided up in accordance with the memory cell capacitance and bit line capacitance. In accordance with the ratio of these two capacitances, i.e., a transfer ratio, this leads to deflection of the bit line voltage. The read/write amplifier situated at one end of the bit line can assess this voltage and can amplify the relatively low potential difference until the bit line has reached the full signal level for a stored logic 1 (corresponding, for example, to a positive supply potential) or the signal level for a logic 0 (corresponding, for example, to a reference potential). These full signal levels are provided by a voltage generator circuit, which is connected to the relevant read/write amplifier.

The magnitude of the supply voltage of memories is being constantly reduced, particularly in view of increasing demands for reliability and low energy consumption. In the course of the reduction, modern integrated memories regulate an externally applied supply voltage to a smaller supply voltage within the memory. On the other hand, higher processing speeds of memories and higher data throughput are demanded, particularly on account of increasing memory size. However, it holds true, particularly with regard to the voltage supply for a read/write amplifier of an integrated memory, that a lower supply voltage for reducing the power consumption also leads to a reduction in the switching speed of the relevant read/write amplifier, if the read/write amplifier for the assessment and amplification operation is activated using the lower supply voltage.

SUMMARY

An integrated memory, in which an assessment and amplification operation can be carried out by a read/write amplifier at a comparatively high switching speed and in which a low power consumption can be provided.

In accordance with the invention, the voltage generator circuit of the integrated memory of the type mentioned can generate a voltage supply for application to the read/write amplifier. A potential difference can be applied to the read/write amplifier using different supply potentials. The voltage generator circuit can increase the potential difference applied to the read/write amplifier for a limited period of time during an assessment and amplification operation of the read/write amplifier. In accordance with the invention, an increased potential difference for application to the read/write amplifier can be made available for that part of an assessment and amplification operation of the read/write amplifier, which is critical for the switching speed, with the result that comparatively high switching speeds of the read/write amplifier can be possible. At the same time, the power consumption of the integrated memory can be reduced as a result of an applied potential difference being comparatively low for the remainder of the period of time.

In accordance with one embodiment of the present invention, the voltage generator circuit can increase a first supply potential at a first terminal of the read/write amplifier and/or can lower a second supply potential at a second terminal of the read/write amplifier during an assessment and amplification operation of the read/write amplifier.

In accordance with the invention, charge-dependent control to generate the increased potential difference using a defined quantity of charge can be implemented in the voltage generator circuit. This means that the increased potential difference can be applied to the read/write amplifier in a charge-controlled manner by a defined capacitance being charged, for example, before the relevant assessment and amplification operation, said capacitance then being discharged again during the assessment and amplification operation.

BRIEF DESCRIPTION OF THE FIGURES

The invention is explained in more detail below with reference to the FIG. s which represent exemplary embodiments for the present invention and are illustrated in the drawing, in which.

DETAILED DESCRIPTION

Figure 1:
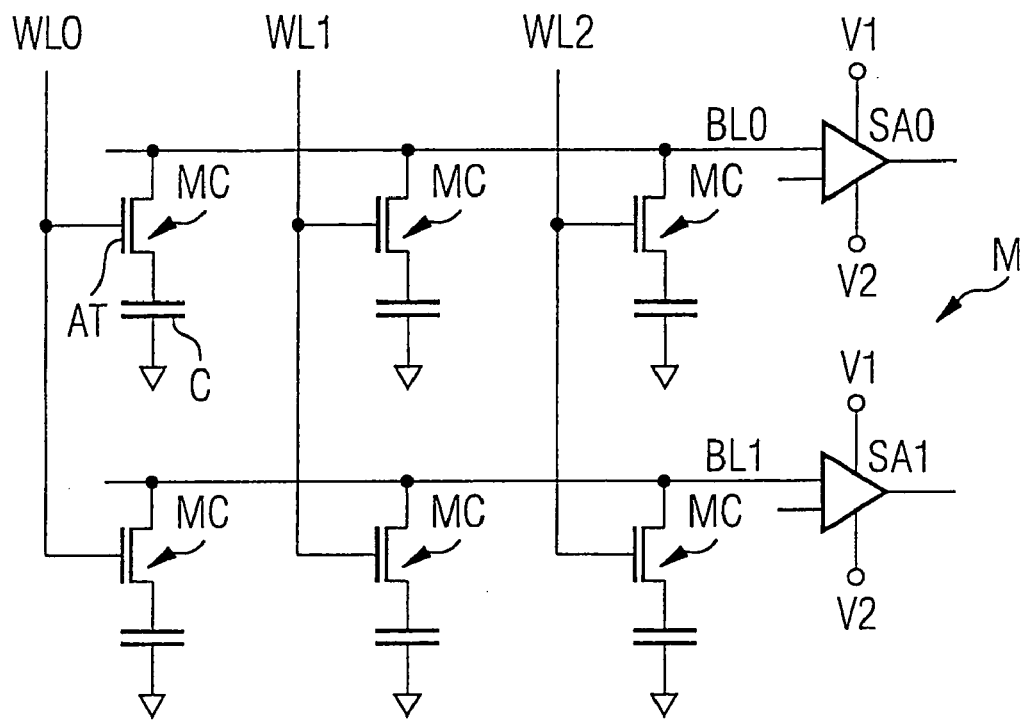
FIG. 1 shows a diagrammatic illustration of a memory cell array of an integrated memory in accordance with the invention.

FIG. 1 shows a diagrammatic illustration of a memory cell array of an integrated memory M, in which memory cells MC are arranged along word lines WL0, WL1, WL2 and bit lines BL0, BL1. The memory cells MC can be arranged at crossover points of the bit lines BL0, BL1 and word lines WL0, WL1, WL2. In the present exemplary embodiment, a limited number of word lines and bit lines are shown for the sake of clarity but in practice, an integrated memory has a plurality of word lines and bit lines. The memory cells MC can each include a storage capacitor C, which is connected to one of the bit lines BL0, BL1 via a selection transistor AT. In order to select one of the memory cells MC, the respective selection transistor AT can be turned on by an activated word line WL0, WL1, WL2 such that a data signal can subsequently be read out from or written to a selected memory cell. The data signal of the selected memory cell is present on the relevant bit line BL0, BL1 and is assessed and amplified in one of the illustrated read/write amplifiers SA0, SA1.

During an operation of reading out a data signal from one of the memory cells, the stored charge can be divided up in accordance with the memory cell capacitance and bit line capacitance. In accordance with the ratio of these two capacitances, this can lead to deflection of the bit line voltage. The read/write amplifiers SA0, SA1 can assess this bit line voltage and, when reading the memory cells, can amplify the relatively low potential difference until the relevant bit line has reached the full signal level for a stored logic 1 (corresponding, for example, to the positive supply potential V1) or the signal level for a logic 0 (corresponding, for example, to the supply potential V2). The supply potentials V1 and V2 can be generated by a voltage generator circuit (not illustrated in FIG. 1), with the result that a corresponding potential difference is present at the sense amplifiers SA0, SA1.

Figure 2:
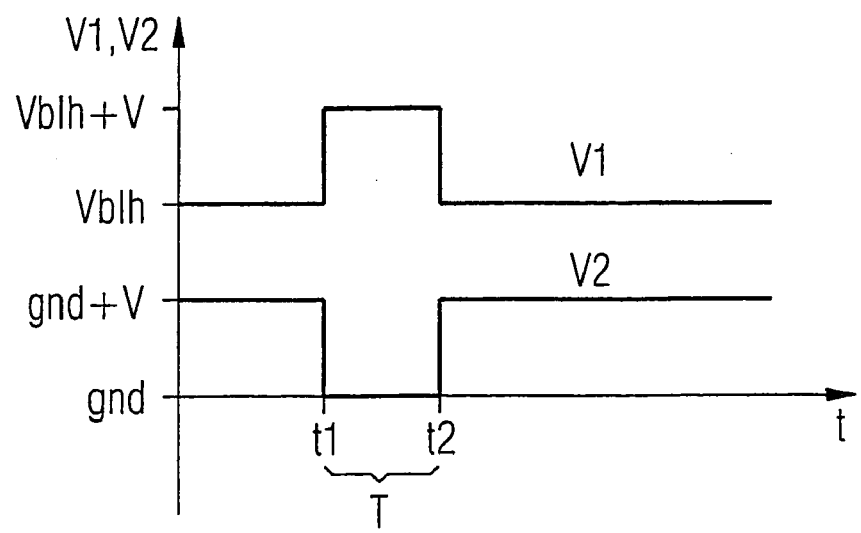
FIG. 2 shows a potential profile of a voltage supply for a read/write amplifier in accordance with the invention.

FIG. 2 shows a potential profile of a voltage supply for the read/write amplifiers SA0, SA1 shown in FIG. 1, in accordance with the principle according to the invention. At the beginning of an assessment and amplification operation, the supply potentials V1=Vblh and V2=gnd+V can be present at the read/write amplifiers SA0, SA1. This comparatively low potential difference between the supply potentials V1 and V2 can make possible a comparatively low power consumption of the memory. In order to increase the switching speed during the assessment and amplification operation of the read/write amplifier, an increased potential difference can be applied to the relevant read/write amplifier SA0, SA1 shown in FIG. 1 for the period of time T between the instants t1 and t2, i.e., at V1=Vblh+V and V2=gnd in the example. In this case, therefore, the supply potential V1 at the upper terminal of the relevant read/write amplifier is increased and the supply potential V2 at the lower terminal of the relevant read/write amplifier can be lowered during the assessment and amplification operation of the read/write amplifier SA0, SA1.

Figure 3A:
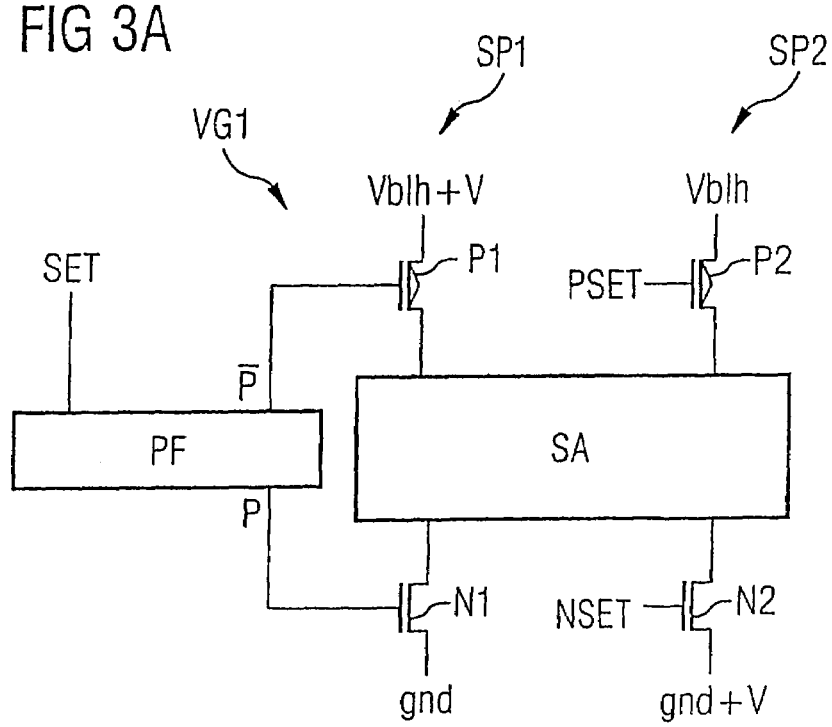
FIGS. 3A and 3B show an embodiment of a voltage generator circuit having a read/write amplifier, with associated signal diagram.
Figure 3B:
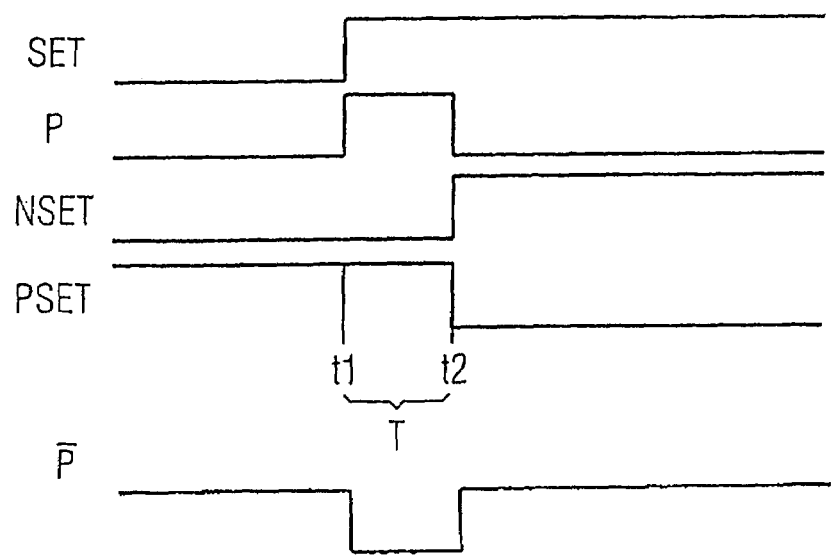

FIGS. 3A and 3B show an embodiment of a voltage generator circuit having a read/write amplifier SA, in which circuit time control is implemented, in accordance with which the potential difference is increased in a defined period of time. The voltage generator circuit VG1 (FIG. 3A) can have a pulse shaper PF, which can drives a PFET transistor P1 and an NFET transistor N1. The transistors P1 and N1 can be connected to the supply potentials Vblh+V and gnd, respectively. The two transistors P1, N1 can be driven with signals IP and P, respectively, which can be inverted with respect to one another. In contrast, the PFET transistor P2 can be connected to the supply potential Vblh and the NFET transistor N2 can be connected to the supply potential gnd+V. In accordance with the illustration shown in FIG. 3A, two supply paths SP1, SP2 of the voltage generator circuit VG1 can be provided for the read/write amplifier SA. The supply paths can have a different potential difference.

FIG. 3B illustrates a signal diagram, in accordance with which the voltage generator circuit VG1 shown in FIG. 3A is operated. For an assessment and amplification operation (starting at the instant t1) of the sense amplifier SA, the control signal SET for the pulse shaper PF can be switched to the active state. As a result, the pulse shaper PF can generate an active signal P, which can turn on the transistor N1. The transistor P1 can be turned on by the inverted signal /P. A control pulse P or /P having a defined time duration T can be generated at the beginning of the assessment and amplification operation of the read/write amplifier SA. The control pulse driving the supply path SP1 can have the higher potential difference. Before the end of the assessment and amplification operation, the control pulse P can be deactivated at the instant t2 and the control signals NSET and PSET are activated for driving the transistors N2 and P2, respectively, with the result that the lower potential difference of the second supply path SP2 can be present at the read/write amplifier SA.

Figure 4A:
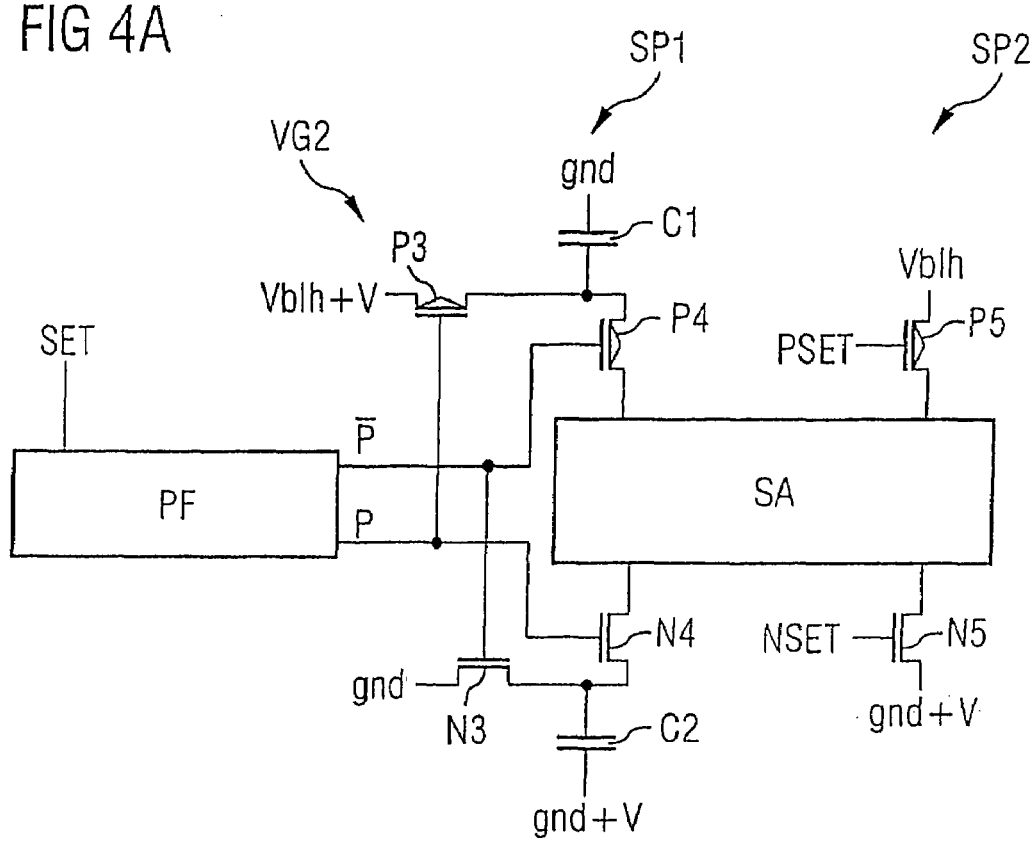
FIGS. 4A and 4B show an embodiment of a voltage generator circuit having a read/write amplifier in accordance with the invention, with associated signal diagram.

FIG. 4A shows an embodiment of a voltage generator circuit VG2 having a read/write amplifier SA in accordance with the invention. Charge-dependent control, which can generate the increased potential difference at the sense amplifier SA using a defined quantity of charge, can be implemented in the voltage generator circuit VG2 shown in FIG. 4A. Like the embodiment shown in FIG. 3A, the voltage generator circuit VG2 shown in FIG. 4A can have two supply paths SP1, SP2 for the read/write amplifier SA. The supply paths can be operated with a different potential difference. Like the corresponding supply paths shown in FIG. 3A, the supply paths SP1, SP2 shown in FIG. 4A can be driven alternatively to one another in time and can be connected to the read/write amplifier SA. The capacitances C1, C2 which can be connected to the supply potentials gnd and gnd+V, respectively, can be connected into the supply path SP1, which can be intended for providing a higher potential difference for the read/write amplifier SA. The capacitances C1, C2 may be connected to the read/write amplifier SA via the PFET transistor P4 and NFET transistor N4, respectively. The transistors P4 and N4 can be driven by the control pulses /P and P, respectively, of a pulse shaper PF. The PFET transistor P3 and the NFET transistor N3 which are connected to the supply potentials Vblh+V and gnd, respectively, are provided for the purpose of charging and discharging the capacitances C1, C2. The transistor P3 can be driven by the control pulse P and the transistor N3 can be driven by the inverted control pulse /P. The read/write amplifier SA may be connected to the supply potential Vblh via the PFET transistor P5 of the second supply path SP2 and to the supply potential gnd+V via the NFET transistor N5.

Figure 4B:
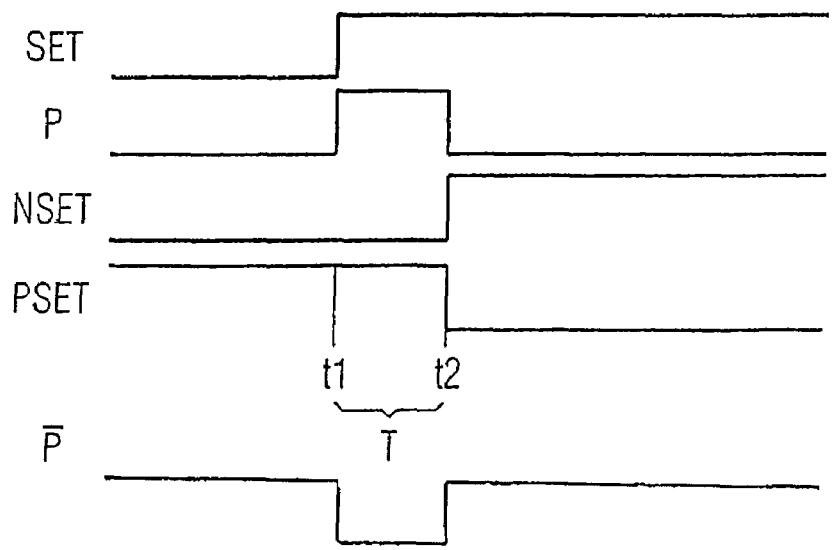

FIG. 4B shows a signal diagram for operating the voltage generator circuit VG2 shown in FIG. 4A. At the beginning of an assessment and amplification operation by the read/write amplifier SA, the control signal SET can be activated at the instant t1 for driving the pulse shaper PF. The capacitances C1, C2 can be connected, by the pulse signals P, /P, to the read/write amplifier SA for the period of time T and can be discharged (C1) and charged (C2) in this state. Before the end of the assessment and amplification operation by the read/write amplifier SA, the control pulse P can be deactivated at the instant t2 and the transistors P5 and N5 can be turned on by the control signals PSET, NSET. Furthermore, the transistors P3 and N3 can be turned on, with the result that the capacitances C1, C2 can be charged and discharged, respectively, for a next assessment and amplification operation. In the case of a next assessment and amplification operation by the read/write amplifier SA, the capacitances can then be connected up at the beginning of the assessment and amplification operation by a new control pulse P, /P of the pulse shaper PF. As a result, the increased potential difference is provided from previously precharged capacitances, which can be isolated from the increased supply over a defined period of time. Since the charge of the capacitances C1, C2 can be reversed using only a relatively low potential difference, the power consumption of the read/write amplifier SA can be limited.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

M integrated memory
WL0, WL1, WL2 word line
BL0, BL1 bit line
Mc memory cells
AT selection transistor
C storage capacitance
SA0, SA1 read/write amplifier
V1, V2 supply potential
Vblh, Vblh+v supply potential
gnd, gnd+v supply potential
t1, t2 instant
T time duration
VG1, VG2 voltage generator circuit
SP1, SP2 supply path
PF pulse shaper
SA read/write amplifier
P1 to P5 transistor
N1 to N5 transistor
P,/P control pulse
SET control signal
NSET, PSET control signal
C1, C2 capacitance

We claim:

1. An integrated memory, comprising:
    a memory cell array, the memory cell array having word lines for selecting memory cells and bit lines for reading out or writing data signals;
    a read/write amplifier, the read/write amplifier being connected to the bit lines for assessing and amplifying data signals; and
    a voltage generator circuit, including
        a first capacitor,
        a first transistor with a first terminal connected to an electrode of the first capacitor and a second terminal connected to a first supply potential,
        a second transistor with a first terminal connected to the electrode of the first capacitor and a second terminal connected to a first terminal of the read/write amplifier, and
        a pulse shaper connected to a control terminal of the first transistor and a control terminal of the second transistor, the pulse shaper controlling the first and second transistors such that the first transistor operates as an open switch and the second transistor operates as a closed switch for a predetermined period of time during an assessment and amplification operation of the read/write amplifier.

2. The integrated memory as claimed in claim 1, wherein the voltage generator circuit further includes
    a second capacitor,
    a third transistor with a first terminal connected to an electrode of the second capacitor and a second terminal connected to a second supply potential,
    a fourth transistor with a first terminal connected to the electrode of the second capacitor and a second terminal connected to a second terminal of the read/write amplifier, and
    the pulse shaper connected to a control terminal of the third transistor and a control terminal of the fourth transistor, the pulse shaper controlling the third and fourth transistors such that the third transistor operates as an open switch and the fourth transistor operates as a closed switch for the predetermined period of time.

3. The integrated memory as claimed in claim 2, wherein the voltage generator circuit has a first and a second supply path, the first supply path including the first and the second capacitors, and the first, second, third, and fourth transistors, and the second supply path including a fifth transistor with a first terminal connected to a third terminal of the read/write amplifier and a second terminal connected to a third supply potential and a sixth transistor with a first terminal connected to a fourth terminal of the read/write amplifier and a second terminal connected to a fourth supply potential, the fifth and sixth transistors controlled to operate as open switches for the predetermined period of time.

4. The integrated memory as claimed in claim 3, wherein an absolute value of a difference between the first supply potential and the second supply potential is greater than an absolute value of a difference between the third supply potential and the fourth supply potential.

* * * * *